United States Patent
Smith et al.

(10) Patent No.: US 8,395,233 B2
(45) Date of Patent: Mar. 12, 2013

(54) INDUCTOR STRUCTURES FOR INTEGRATED CIRCUIT DEVICES

(75) Inventors: David M. Smith, Sebastian, FL (US); Jeffrey A. Schlang, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 428 days.

(21) Appl. No.: 12/490,605

(22) Filed: Jun. 24, 2009

(65) Prior Publication Data

US 2010/0327404 A1    Dec. 30, 2010

(51) Int. Cl.
*H01L 27/08* (2006.01)

(52) U.S. Cl. .............. 257/531; 257/E29.1; 257/758; 336/223

(58) Field of Classification Search .......... 257/531, 257/E29.001, 758; 336/223
See application file for complete search history.

(56) References Cited

U.S. PATENT DOCUMENTS

| | | | |
|---|---|---|---|
| 4,833,437 A | 5/1989 | Williamson | |
| 5,206,621 A | 4/1993 | Yerman | |
| 5,410,289 A | 4/1995 | Futa | |
| 5,949,383 A | 9/1999 | Hayes et al. | |
| 6,064,108 A | 5/2000 | Martinez | |
| 6,094,335 A | 7/2000 | Early | |
| 6,111,545 A | 8/2000 | Saari | |
| 6,163,300 A | 12/2000 | Ishikawa et al. | |
| 6,232,925 B1 | 5/2001 | Fujikawa | |
| 6,337,663 B1 | 1/2002 | Chi-Ming | |
| 6,356,244 B1 | 3/2002 | Mizuno et al. | |
| 6,664,026 B2 | 12/2003 | Nguyen et al. | |
| 6,714,113 B1 | 3/2004 | Abadeer et al. | |
| 6,756,708 B2 | 6/2004 | Koeneman | |
| 6,891,219 B2 | 5/2005 | Allman et al. | |
| 6,894,646 B2 | 5/2005 | Washiro et al. | |
| 6,972,635 B2 | 12/2005 | McCorquodale et al. | |
| 7,035,083 B2 | 4/2006 | Lin et al. | |
| 7,064,629 B2 | 6/2006 | Shoji | |
| 7,068,139 B2 | 6/2006 | Harris et al. | |
| 7,126,452 B2 | 10/2006 | Teshima et al. | |
| 7,202,821 B2 | 4/2007 | Fujikawa et al. | |
| 7,477,123 B2 | 1/2009 | Beerling | |
| 7,486,237 B2 | 2/2009 | Huang et al. | |
| 7,671,515 B2 | 3/2010 | Metz et al. | |
| 7,675,463 B2 | 3/2010 | Wallace et al. | |
| 2003/0122219 A1 | 7/2003 | Park | |
| 2004/0046232 A1 | 3/2004 | Lee et al. | |

(Continued)

OTHER PUBLICATIONS

Information about Related Patents and Patent Applications, see section 6 of the accompanying Information Disclosure Statement Letter, which concerns Related Patents and Patent Applications.

(Continued)

*Primary Examiner* — Eugene Lee
*Assistant Examiner* — Elias M Ullah
(74) *Attorney, Agent, or Firm* — Fox Rothschild, LLP; Robert J. Sacco

(57) ABSTRACT

An IC device (100) includes an IC body (106) having a base layer (108) and first and second upper layers (114, 116) on the base layer. The IC body includes a cavity region (104) extending through said base and first upper layers and at least a portion of said second upper layer. In the IC device, a portion of said second upper layer in the cavity region comprises a planar inductive element (102) having first and second contacting ends (140, 142). In the IC device, at least one support member (128, 130, 132) extends at least partially into said cavity region from said IC body in at least a first direction parallel to said base layer and intersects at least a portion of said planar inductive element.

12 Claims, 7 Drawing Sheets

U.S. PATENT DOCUMENTS

| | | | |
|---|---|---|---|
| 2006/0203421 | A1 | 9/2006 | Morris, III et al. |
| 2007/0256502 | A1 | 11/2007 | Aebersold et al. |
| 2008/0055815 | A1 | 3/2008 | Rottenberg |
| 2008/0122020 | A1 | 5/2008 | Metz et al. |
| 2009/0188325 | A1 | 7/2009 | Aebersold et al. |

OTHER PUBLICATIONS

Harris Corporation, International Search Report mailed Jul. 22, 2011, Application Serial No. PCT/US2011/037263.

Samavati, H., et al., "Fractal Capacitors", IEEE Journal of Solid-State Circuits, vol. 33, No. 12, Dec. 1998; pp. 2035-2041.

Kim, K., et al., "Circuit Modeling of Interdigitated Capacitors Fabricated by High-K LTCC Sheets", ETRI Journal, vol. 28, No. 2, Apr. 2006; pp. 182-190.

Smith, D., U.S. Appl. No. 12/783,880, filed May 20, 2010, entitled "High Q Vertical Ribbon Inductor on Semiconducting Substrate".

Smith, D., U.S. Appl. No. 12/850,400, filed Aug. 4, 2010, entitled "Vertical Capacitors Formed on Semiconducting Substrates".

500

525

550

575

INDUCTOR STRUCTURES FOR INTEGRATED CIRCUIT DEVICES

BACKGROUND OF THE INVENTION

1. Statement of the Technical Field

The invention is directed to integrated circuit (IC) devices, and more particularly IC devices including inductor structures formed therein.

2. Description of the Related Art

Reactive components, such as capacitors and inductor, are important components for implementing various types of signal processing devices, including low-noise amplifiers (LNAs), voltage controlled oscillators (VCOs), filters, and impedance matching networks, to name a few. As a result, a significant number of components are typically needed to implement such devices. However, the number of components for such devices can be reduced by using an IC including inductors and capacitors formed therein. As a result, signal processing devices can be formed in a compact package, reducing overall device size.

The performance of inductors, including inductors formed within an IC (monolithic inductor), is typically evaluated based on the quality (Q) factor. An ideal inductor will generally be lossless irrespective of the amount of current through the winding. However, inductors, including monolithic inductors, typically have winding resistance from the electrically conductive materials used for forming the coils. Since the winding resistance appears as a resistance in series with the inductor, it is often called the series resistance. The inductor's series resistance converts electrical current through the coils into heat, thus causing a loss of inductive quality. The Q factor measures this loss (i.e., the inductor's efficiency), as Q factor for an inductor is the ratio of its inductive reactance to its resistance at a given frequency. In general, the higher the Q factor of the inductor, the closer it approaches the behavior of an ideal, lossless, inductor. In general, the Q factor of an inductor can be computed from $Q=(\omega L)/R$, where R is its internal electrical resistance of the inductor and $\omega L$ is capacitive or inductive reactance at resonance.

In the case of monolithic inductors, the Q factor is primarily limited by conductor losses arising from conductor resistances, the conductive silicon substrate, and parasitic substrate capacitances (which lower the inductor self-resonant frequency). Additionally, time-varying magnetic fields can penetrate the silicon substrate and cause eddy currents as per Lenz's law, thus resulting in power loss. Furthermore, eddy currents create their own magnetic fields that oppose those of the monolithic inductor and effectively decrease the inductance of the inductor.

SUMMARY OF THE INVENTION

Embodiments of the invention provide methods for forming ICs including improved monolithic inductors and IC devices therefrom. In a first embodiment of the invention, an IC device is provided. The IC device includes an IC body including at least one base layer, at least a first upper layer disposed on the base layer and at least a second upper layer disposed on the first upper layer. The substrate includes at least one cavity region extending through at least the base layer, the first upper layer, and at least a portion of the second upper layer. The base layer includes at least one ground plane layer. In the IC device, a portion of the second upper layer in the cavity region includes at least one planar inductive element substantially parallel to the base layer. The planar inductive element has a first contacting end and a second contacting end. In the IC device, at least one support member extends at least partially into the cavity region from the IC body in at least a first direction parallel to the base layer, where the support member intersects at least a portion of the planar inductive element.

In a second embodiment of the invention, a method for fabricating is provided. The method includes forming an IC body including at least one base layer, at least a first upper layer disposed on the base layer, and at least a second upper layer disposed on the first upper layer. In the method, at least a portion of the second upper layer includes at least one planar inductive element substantially parallel to the base layer and having a first contacting end and a second contacting end. The method also includes forming at least one cavity region in the IC body to expose the planar inductive element, where the cavity region extends through at least the base layer, the first upper layer, and at least a portion of the second upper layer. The forming step defines at least one support member extending at least partially into the cavity region from the IC body in at least a first direction parallel to the base layer, where the support member intersects at least a portion of the planar inductive element.

In a third embodiment of the invention, an IC is provided. The IC includes an IC body including at least one base layer, at least a first upper layer disposed on the base layer, and at least a second upper layer disposed on the first upper layer. The substrate includes at least one cylindrical cavity region extending through at least the base layer, the first upper layer, and at least a portion of the second upper layer, where a central axis of the cylindrical cavity region is substantially perpendicular to the base layer. The base layer includes at least one ground plane layer. In the IC, a portion of the second upper layer in the cavity region includes at least one circular spiral planar inductive element substantially parallel to the base layer. The planar inductive element includes a first contacting end coupled to at least a first electrically conductive trace and a second contacting end coupled to at least a second electrically conductive trace In the IC, a plurality of support members extend radially from a central axis of the cylindrical cavity region, where the support members intersect at least a portion of the planar inductive element.

DETAILED DESCRIPTION

Figure 1:
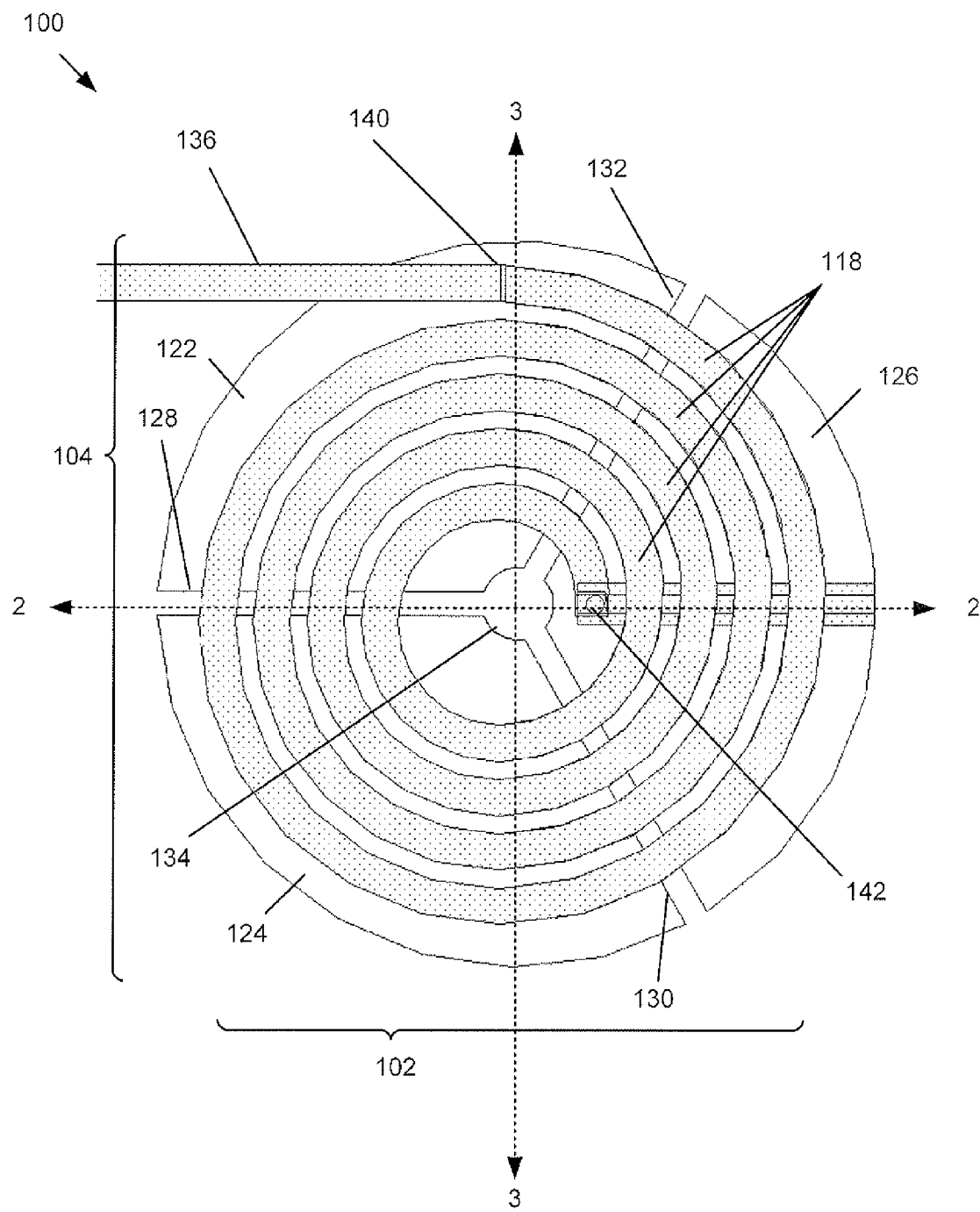
FIG. 1 is a top view of an exemplary IC, including a monolithic inductor, in accordance with an embodiment of the invention.

The invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

Embodiments of the invention describe methods for forming IC devices including monolithic inductors with improved Q factor and IC devices therefrom. The term "IC device", as used herein, refers to ICs in general or to any electronic device including one or more components comprising ICs. In conventional IC devices, monolithic inductors are typically formed by forming an inductive element on a substrate including a ground plane layer, where the inductive element is formed directly above the ground plane layer. The term "ground plane layer", as used herein refers an electrically conductive layer, typically biased to a reference voltage during operation of the monolithic inductor. Unfortunately, monolithic inductors formed in this fashion typically have an inductance values per square area and Q factors that are substantially lower as compared to an ideal inductor. These lower inductance values and Q factors for conventional monolithic inductors typically result in ICs which have limited insertion loss and poor bandwidth performance. Consequently, conventional monolithic inductors are typically unsuitable for many IC device applications.

One solution has been to use external inductor coil elements. However, as described above, such approaches increase device size and complexity, as additional electrical traces and/or components need to be provided for an IC to contact the external inductor coil element. Another solution to these problems has been the complete removal of all material surrounding an inductive element formed in an IC. In such processes, the inductive element is suspended in air, minimizing parasitic loss to the substrate due to eddy currents, reduction of sheet resistance, and an increased Q factor. Such a configuration also raises the self-resonant frequency for the inductive element. However, such structures are typically more susceptible to damage, making such structures generally unreliable for some applications.

Embodiments of the invention overcome the various limitations of conventional monolithic inductors by combining the improved performance of suspended inductors with the relative structural stability of conventional monolithic inductors formed on substrate surfaces. In the various embodiments of the invention, a monolithic inductor is provided by having an inductive element within a cavity region of a substrate, where the cavity region is formed to include one or more support members for supporting the inductive element. Such a configuration provides a significant increase in Q factor (>15%) and self-resonant frequency (>150%) over conventional square spiral inductor configurations on solid semiconductor substrates. This enhanced performance allows smaller and reliable inductive elements to be formed within the IC, allowing for a decrease in the overall size of a device.

Although the various embodiments of the invention will be described with respect to an exemplary configuration including a circular spiral inductive element, the invention is not limited in this regard. Rather, the various embodiments of the invention can be utilized with any type of substantially planar inductive elements, including spiral, meandering, and serpentine planar inductive elements, to name a few. The term "substantially planar", as used herein with respect to feature formed in a layer of an IC or a layer formed in an IC, refers to a feature or layer in which the difference between a highest and lowest point of the layer or feature, with respect to the substrate of the IC, is less than twice the thickness of the layer or the layer defining the feature. Additionally, although the various embodiments of the invention will be described with respect to a monolithic inductor formed using a silicon comprising substrate, the invention is not limited in this regard. In other embodiments of the invention, the monolithic inductors can be fabricated using any other types of semiconductor-comprising substrates, including other silicon and non-silicon comprising substrates.

Figure 2:
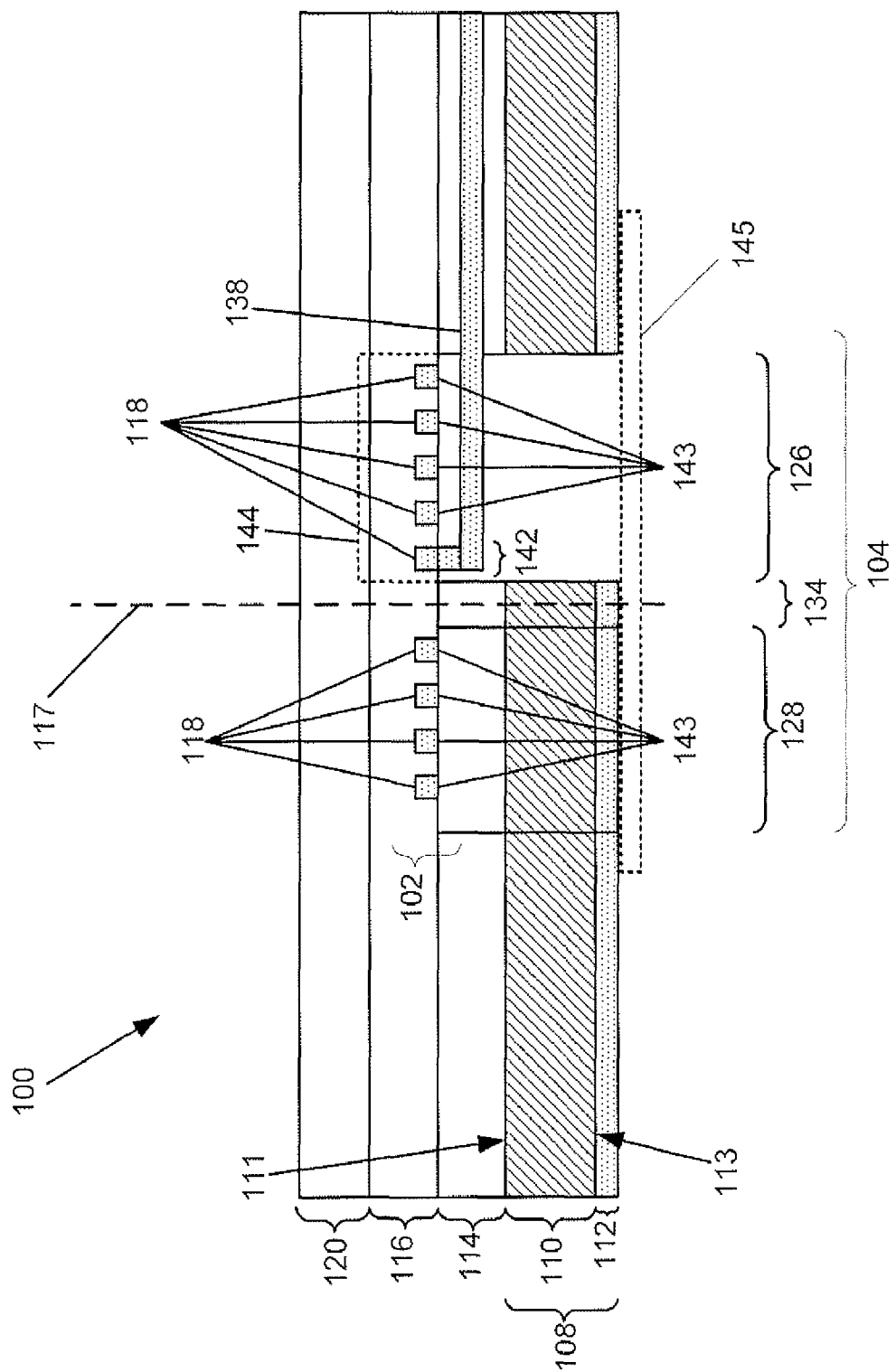
FIG. 2 is a cross-sectional side view of the IC in FIG. 1 along cutline 2-2.
Figure 3:
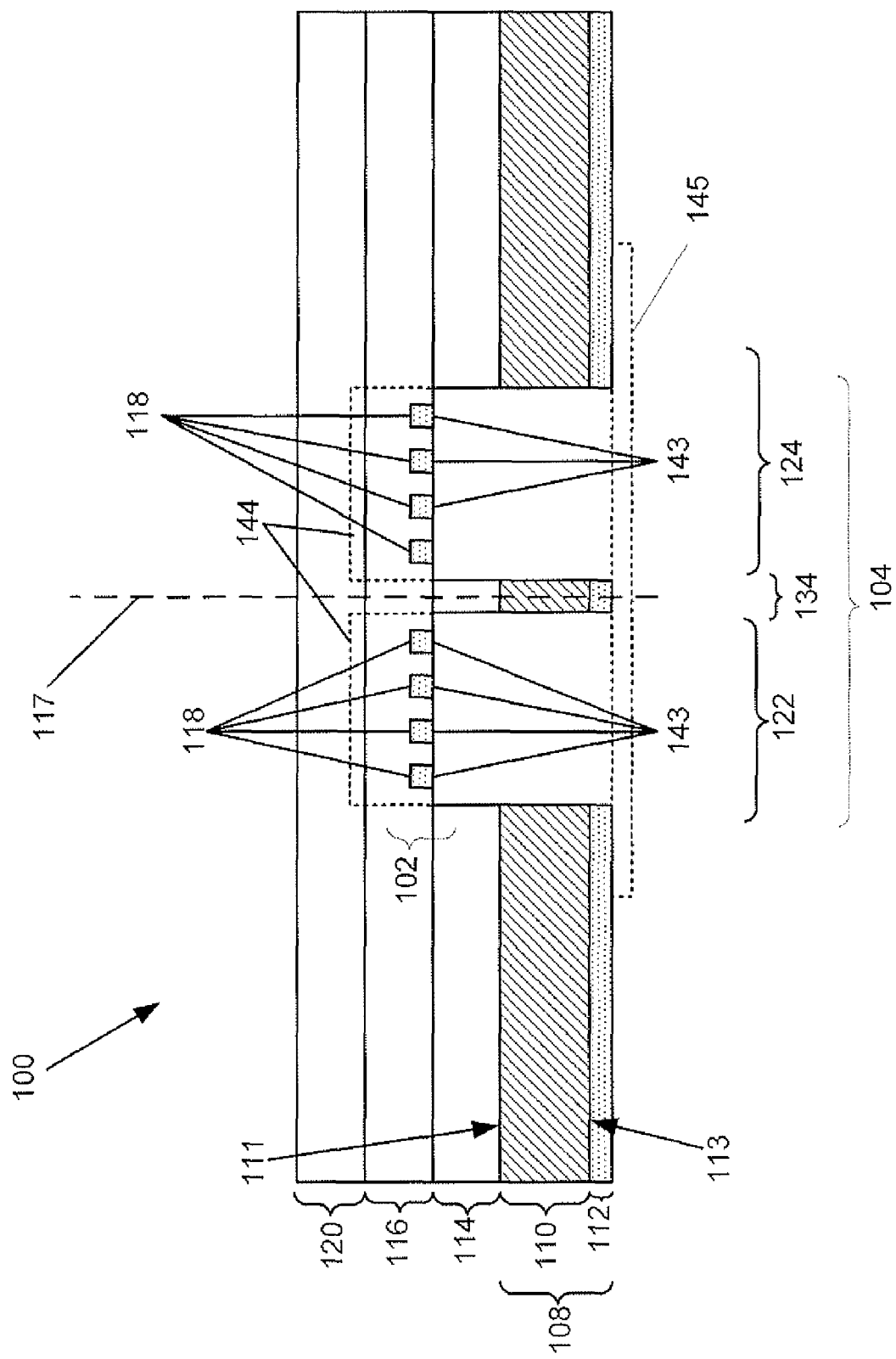
FIG. 3 is a cross-sectional side view of the IC in FIG. 1 along cutline 3-3.

Referring initially to FIGS. 1, 2, and 3, an exemplary monolithic inductor 100 in accordance with an embodiment of the invention is shown. FIG. 1 is a top view of an exemplary IC 100, including a monolithic inductor, in accordance with an embodiment of the invention. FIG. 2 is a cross-sectional side view of the IC 100 in FIG. 1 along cutline 2-2. FIG. 3 is a cross-sectional side view of the IC 100 in FIG. 1 along cutline 3-3. As shown in FIGS. 1-3, the IC 100 comprises a planar inductive element 102 disposed in a cavity region 104 formed within an IC body 106.

In the various embodiments of the invention, the IC body 106 can be formed according to conventional semiconductor processing methods for forming a conventional monolithic inductor. For example, as shown in FIGS. 1-3, a base layer 108 of the IC body can be formed by providing a substrate 110, such as a substrate having a semiconductor-comprising upper surface 111, and forming a ground plane layer 112 on the backside of the substrate 110. Afterwards, one or more first upper layers 114 can be formed on the upper surface 111. The first upper layers 114 can include any layers provided for forming active devices on the upper surface 111 or for providing local and/or global electrical connections for the IC 100. Once the first upper layers 114 are formed, one or more second upper layers 116 can be formed on top of the first upper layers 114. The second upper layers 116 can also include local and/or global electrical connections for the IC 100. The second upper layers 116 can further include inductive traces for forming the inductive element 102. After the second upper layers 116 are formed, one or more third upper layers 120 can be formed on top of the second upper layers 116. The third upper layers 120 can also include local and/or global electrical connections for the IC 100.

In the various embodiments of the invention, once the IC body 106 is formed, the cavity region 104 can be formed. In particular, at least portions of the base layers 108, the first upper layers 114, and the second upper layers 116, are removed to expose a substantial portion of the inductive element 102. In the exemplary IC 100 shown in FIGS. 1-3, the cavity region is a cylindrical cavity region having a central axis 117 substantially perpendicular to the base layers 108.

For example, a lithography process can be used to form a masking pattern on the ground plane layer 112. In FIGS. 1-3, a three-spoke pattern is used. That is, the masking pattern is configured such that the etch processes result in three cavities 122, 124, 126 formed in the cavity region 104. The cavities 122, 124, 126 are separated by support members 128, 130, 132 formed by the remaining material in the cavity region 104. As shown in FIGS. 1-3, a hub 134, having a width greater than that of the support members 128, 130, 132, is provided at the intersection of support members 128, 130, and 132 to increase strength and stability.

However, in other embodiments of the invention, the support members 128, 130, 132, can intersect without a hub 134. Alternatively, no hub can be provided. That is, the support members 128, 130, 132 do not intersect. The configuration of these and other masking patterns will be described below in greater detail with respect to FIGS. 5A-5D and FIGS. 6A-6D.

In the various embodiments of the invention, the size of the supporting members and the hub (if included) can vary. For example, the width of the supporting members 128, 130, 132, as compared to the width of the traces of the inductive element 102 can vary. However, improved performance (higher Q factor) is provided as the width of the supporting members is decreased. Similarly, as the hub size is reduced or eliminated, improved performance (higher Q factor) is also provided.

Once the masking pattern is formed, various dry and/or wet etching processes can be used to remove portions of the ground plane layer 112, the substrate 110, the first upper layers 114, and the second upper layers 116 to form cavities 122, 124, 126, and support members, 128, 130, 132 In some embodiments, additional etching processes can be used to remove portions of the third upper layers 120. The etch processes used are selected so that the inductive traces 118 and any other electrical traces 136, 138 contacting the contacting ends 140, 142 of the inductive element 102 are not removed despite the removal of any surrounding material. For example, in the case of metal layers, such as copper, aluminum, and/or gold comprising metal layers, interspersed between silicon-comprising dielectric layers, such as silicon oxides and/or silicon nitrides, an etch process selective to the dielectric layers is utilized to form the cavities 122, 124, 126 without significant removal of the metal layers comprising the inductive element 102.

As described above, three support members 128, 130, 132 are formed which contact the inductive traces 118. However, the amount of the inductive element exposed can vary. For example, as shown in FIGS. 2 and 3, only a lower portion of the inductive traces 118 can be exposed in the cavities 122, 124, 126. However, the invention is not limited in this regard. In some embodiments, as described above, further etching of the second 116 and third 120 upper layers can be performed to extend cavities 122, 124, 126 (shown by dotted regions 144 in FIGS. 2 and 3) and form an air gap above the planar element 102 to improve Q factor. In such embodiments, the support members 128, 130, 132 can extend over the height (h) of the cavity and into the second 116 and third 120 upper layers. Accordingly, in the various embodiments of the invention, the inductive element 102 is generally only partially exposed as portions of the inductive traces 118 are embedded within intersecting support members 128, 130, 132. However, these intersecting support members 128, 130, 132 provide increased stability over approaches in which the inductive traces 118 are suspended in air, while still providing an improved Q factor.

In the various embodiments of the invention, the support members 128, 130, 132 can have widths greater than, less than, or equal to the widths of the inductive traces 118. However, by reducing the widths of the support members 128, 130, 132, the amount of parasitic loss to the substrate due to eddy currents and sheet resistance can be reduced, providing an increased Q factor, but while still providing enhanced stability for the inductive element 102. Accordingly in some embodiments of the invention, the widths of the support members 128, 130, 132 are selected, by configuring the masking pattern used, to use the minimum dimensions possible with respect to the semiconductor fabrication process being used. As described above, as the width of the support members is reduced, higher Q factor can be obtained. However, if the inductive element begins to deform, the inductor value can change, possibly degrading performance. Therefore, in some embodiments of the invention, the width of the members can be selected to provide support for the inductive element without causing deflection of any of its members. That is, depending on the configuration of the inductive element, the number and widths of support members can be selected to reduce or eliminate any distortions during fabrication or use.

Furthermore, increased performance is provided by arranging the support members 128, 130, 132 to extend substantially perpendicular (±5 degrees) to the inductive traces. This reduces the amount of overlap between the support members 128, 130, 132 and the inductive traces 118, further reducing the parasitic losses and sheet resistance. This further enhances the Q factor and increases the self-resonant frequency.

In some embodiments of the invention, the inductive traces can be exposed to an ambient environment. However, depending on the composition of the inductive traces, this can result in corrosion of the exposed portions of the inductive traces. As a result of this corrosion, the Q factor may be degraded, offsetting the improvement obtained by the configuration in FIGS. 1-3. Therefore, in other embodiments of the invention, the inductive traces can be protected by covering cavities 122, 124, 126, with one or more lid structures 145. In such embodiments, the cavities can be filled with an inert gas, with respect to inductive traces 118, and lid 145 can be used to seal the cavities to maintain an inert gas environment around the inductive traces. In FIG. 3, lid 145 is shown extending only over a portion of substrate 110, but the invention is not limited in this regard, and lid 145 can extend over the entire area of substrate 110.

Figure 4:
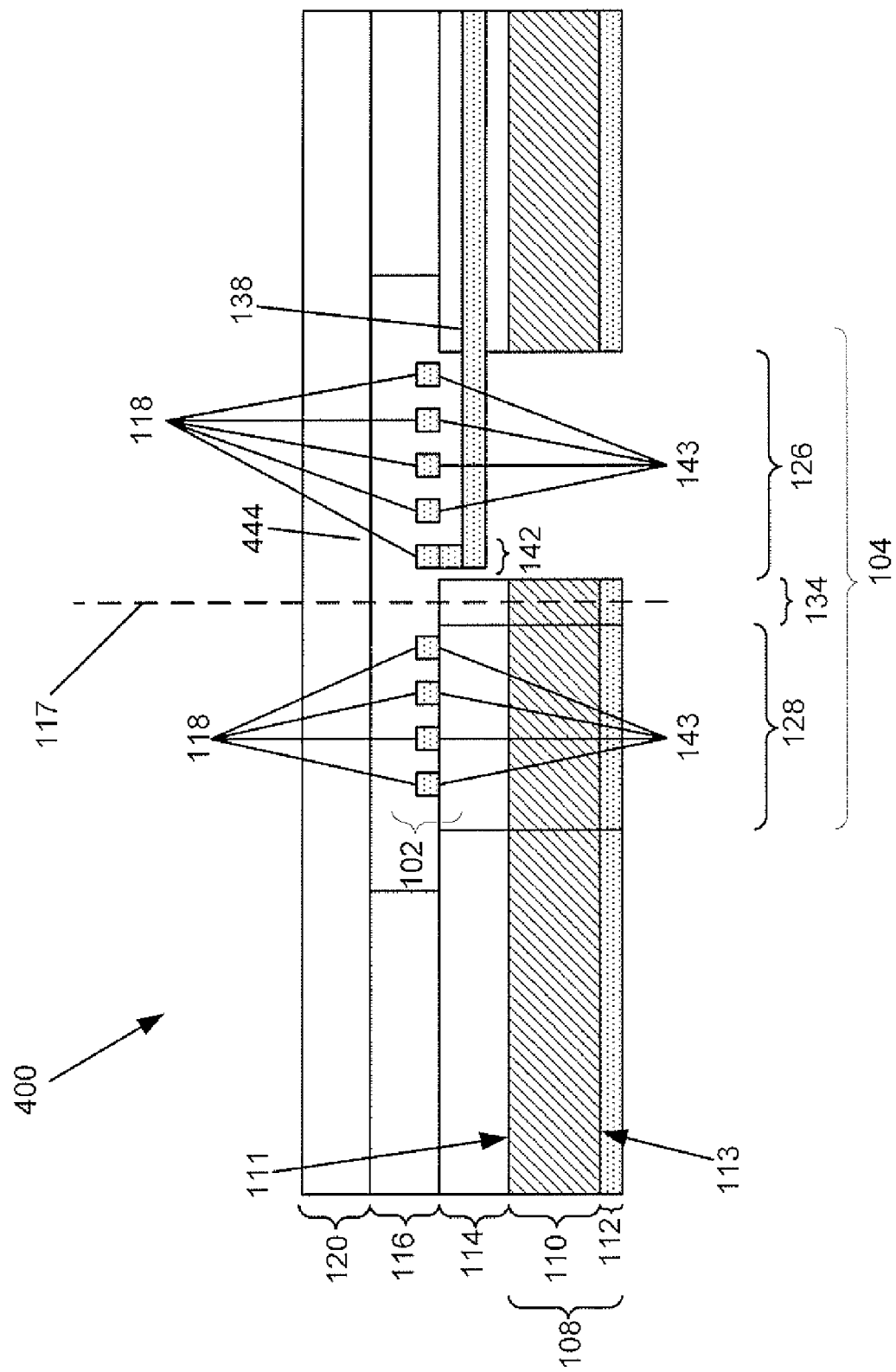
FIG. 4 is a cross-sectional side view of another exemplary IC, including a monolithic inductor, in accordance with an embodiment of the invention.

FIGS. 2 and 3 show that inductive traces 118 are fully embedded within support members 128, 130, and 132. However, in other embodiments of the invention, the inductive traces can be configured to rest upon or only be partially embedded within the support members. An example of such a configuration is shown in FIG. 4. FIG. 4 is a cross-sectional side view of another exemplary IC 400, including a monolithic inductor, in accordance with an embodiment of the invention. As shown in FIG. 4, IC 400 is configured substantially similar to IC 100, as shown in FIG. 2. However, unlike IC 200, IC 400 includes cavity 444 extending through at least layer 116 over the area of inductor 102, resulting in inductive traces 118 laying upon or at least only partially embedded within members 128, 130, 132. Such a configuration further increases the air gap around inductor 102 while still supporting inductor 102. As a result, an improvement in Q factor, as compared to the configuration shown for IC 100, is obtained for IC 400 due to the increased area of inductor 102 exposed to air.

Figure 5A:
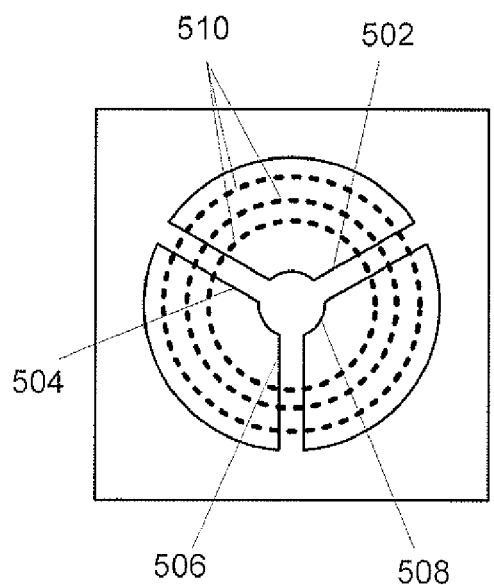
FIGS. 5A-5D are top views of exemplary masking patterns for forming cavity regions corresponding to circular spiral planar inductors in accordance with an embodiment of the invention.

A previously described, various types of masking patterns can be used to form the cavity region. For example, FIGS. 5A-5D show top cross-sectional views of exemplary masking patterns for use with circular area inductive elements to form a monolithic inductor in accordance with an embodiment of the invention. FIG. 5A shows an exemplary masking pattern 500 used for forming the monolithic inductor in FIGS. 1-3. As shown in FIG. 5A, the masking pattern 500 includes features 502, 504, 506 for forming the support members 128, 130, 132 in the cavity region and a feature 508 for forming the hub 134 for the support members in the cavity region. As previously described, the masking pattern 500 can be configured such that the features 502, 504, 506 form support members that intersect the circular paths 510 of inductive traces at substantially perpendicular angles. For example, for the circular paths 510 in a circular cavity region, the features 502, 506, 508 extend towards feature 508 for forming a hub at the center of the cavity region.

Figure 5B:
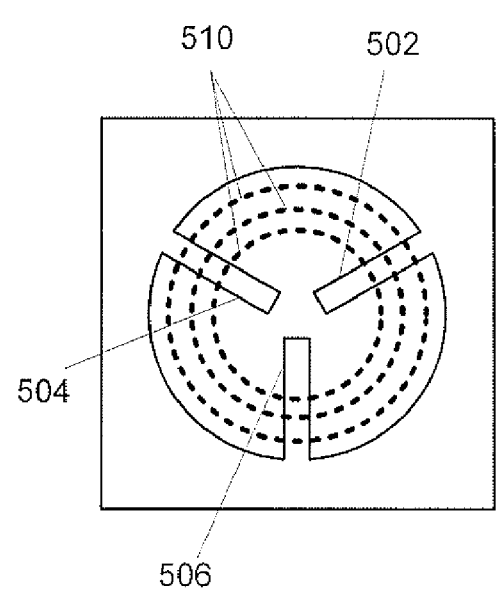

However, masking patterns are not limited to only that shown in FIG. 5A. As previously described, a masking pattern can be provided that excludes a hub. Such a configuration is shown in FIG. 5B. As shown in FIG. 5B, the masking pattern 525 still includes features 502, 504, 506 for forming support members in a cavity region, but no feature is included for forming a hub. Accordingly, the support members resulting from masking pattern 525 do not intersect. However, the masking pattern 525 can be configured such that the features 502, 504, 506 form support members that intersect the circular path 510 of inductive traces perpendicularly.

In the masking patterns shown in FIGS. 5A and 5B, features are provided for forming at least three support members. However, the various embodiments of the invention are not limited in this regard and features for forming any number of support members can be provided. A greater number of features can be provided for forming additional support members, albeit at a cost of performance of the inductive element. That is, as the number of support members is increased, additional sheet resistance and parasitic losses can occur, degrading the Q factor for the inductive element. A lower number of features can be provided, albeit at a cost of stability. Such configurations are shown in FIGS. 5C and 5D.

Figure 5C:
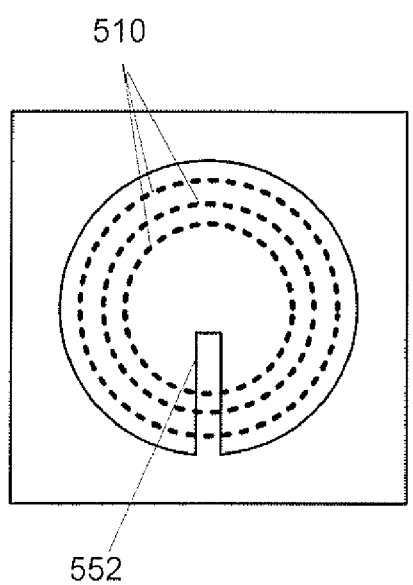
Figure 5D:
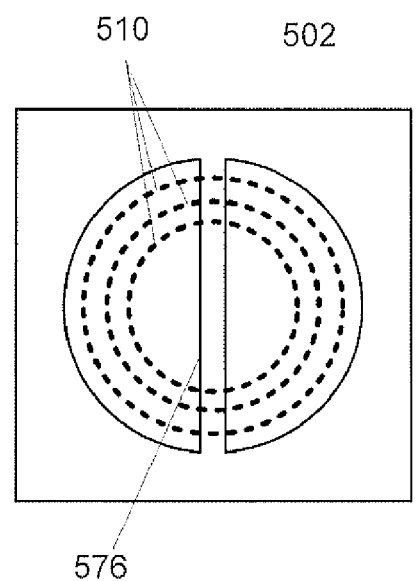

In FIG. 5C, a masking pattern 550 is shown including a single feature 552 for forming a single support member perpendicular to the path 510 of the inductive traces. Such a configuration increases inductive element performance, but reduced stability is provided since only a single portion of the inductive element is supported. However, such a configuration can provide stability if used in conjunction with electrical traces somewhat perpendicular (~80-100 degrees) to the support member formed by feature 552. That is, the support member formed by features 552 supports a portion of the inductive element and the electrical traces extending from the side support member of the cavity support the other portions. This configuration can be improved, albeit with a reduction in performance, by providing the masking pattern in FIG. 5D. In the configuration in FIG. 5D, the masking pattern 575 includes a single feature 576, but the feature 576 extends across the width of the opening. Although full support of the inductive element is still not provided by the single support member formed by feature 576, more of the inductive element is supported, reducing the amount of support that needs to be provided by the electrical traces contacting the inductive element.

Although the various embodiments of the invention shown above describe circular inductive elements and corresponding cavity regions, the invention is not limited in this regard. Rather, as described above, the various embodiments of the invention are equally applicable for forming corresponding cavity regions for inductor elements of any shape. For example, for rectangular or squared-shaped inductive elements, a corresponding rectangular or square-shaped cavity region can be formed. For example, FIGS. 6A-6D are top views of exemplary masking patterns for forming cavity regions for use with rectangular area inductive elements in accordance with an embodiment of the invention.

Figure 6A:
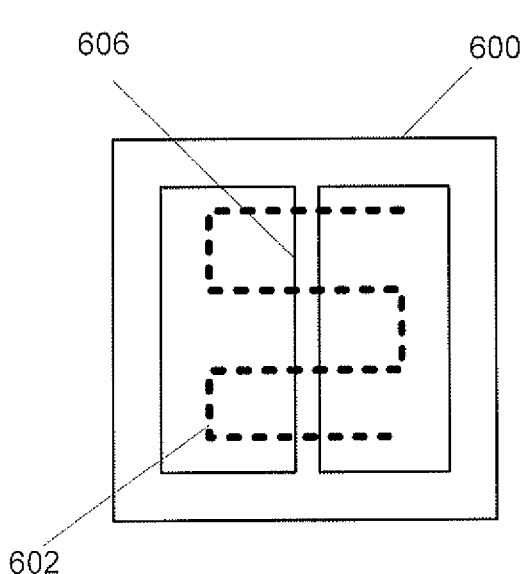
FIGS. 6A-6D are top views of exemplary masking patterns for forming cavity regions corresponding to rectangular planar inductors in accordance with an embodiment of the invention.
Figure 6B:
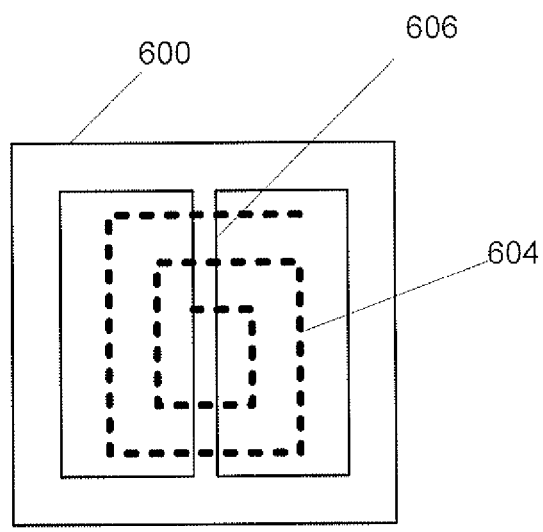
Figure 6C:
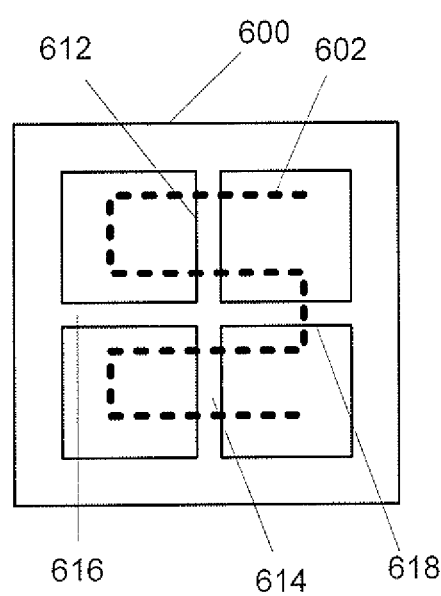
Figure 6D:
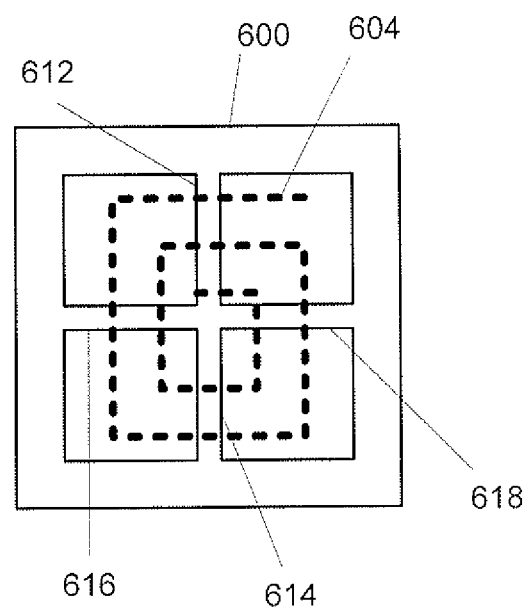

FIGS. 6A and 6B show an exemplary masking pattern suitable for a serpentine path 602 or a rectangular spiral path 604. Similar to the masking pattern shown in FIG. 5D, masking pattern 600 includes a single feature 606 for forming a single support member extending across the opening of a cavity region. As in FIGS. 5A-5D, the feature 606 is configured for providing support members extending substantially perpendicular (±5 degrees) to the paths 602 or 604. As in FIGS. 4C and 4D, the electrical traces contacting the inductive element will only provide some portion of the support. However, other masking patterns can be provided to improve support and reliability of the inductive element. For example, as shown in FIGS. 6C and 6D, a masking pattern 610 can be provided for forming multiple support members. As shown in FIGS. 6C and 6D, features 612, 614, 616, and 618 can be provided to allow a pair of intersecting support members to be formed in the cavity region. The increased number of support members results in increased stability and reliability of the inductive element.

EXAMPLES

The following non-limiting Examples serve to illustrate selected embodiments of the invention. It will be appreciated that variations in proportions and alternatives in elements of the components shown will be apparent to those skilled in the art and are within the scope of embodiments of the invention.

Figure 7:
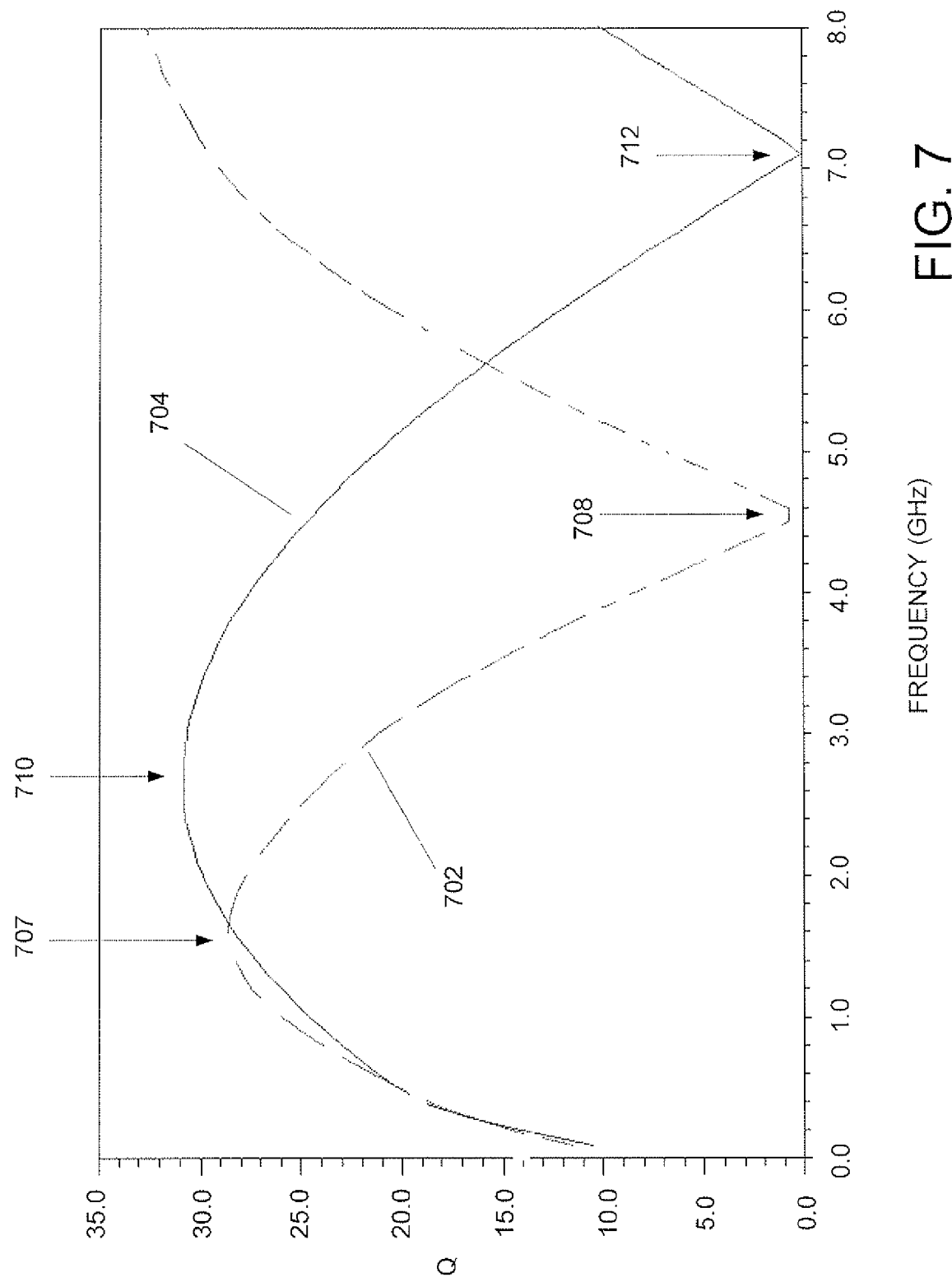
FIG. 7 is a x-y plot of simulation results of frequency versus Q factor for a ICs including a conventional spiral monolithic inductor and a spiral monolithic inductor in an IC configured in accordance with an embodiment of the invention.

FIG. 7 is a x-y plot 700 of simulation results (curve 702) of frequency versus Q factor for a conventional IC including a spiral monolithic inductor and simulation results (curve 704) of frequency versus Q factor for an IC including a spiral monolithic inductor formed in accordance with an embodiment of the invention. For purposes of the simulation, a silicon substrate having a thickness of 90 µm was provided. Furthermore, a ground plane was defined on the backside of the silicon substrate having a thickness of 2 µm and comprised of gold. On the upper surface of the silicon substrate a 2 µm thick silicon dioxide ($Si_xO_y$) dielectric layer was defined. On top of this dielectric layer, the monolithic inductor was defined as gold-comprising circular spiral inductive element with a first contacting end along its outer edge and a second contacting end near its center, similar to the inductive element shown in FIGS. 1-3. In particular, the exemplary configuration used for generating the data in FIG. 7 included a planar inductive element having a trace width of 30 µm and a spacing of 15 µm. The contacting ends of the inductive element were also configured as gold-comprising electrical traces. The contacting ends were configured to provide a 50 ohm characteristic impedance. For purposes of the simulation and similar to the configuration shown in FIGS. 1-3, a first of the electrical traces contacting a first contacting end of the inductive element was defined to also be a gold-comprising electrical trace formed on the surface of the dielectric layer. The second of the electrical traces contacting the second contacting end of the inductive element was defined to be formed within the dielectric layer and coupled to the inductive element using a gold-comprising via formed in the IC. For purposes of the simulation, these traces also had a width of 30 µm and the diameter of the via coupling the first contacting end and the first electrical trace was 15 µm.

As described above, the simulation results for the conventional IC are shown by curve 702 in FIG. 7. Curve 702 (dashed curve) shows that for the conventional IC, a Q factor of approximately 28.5 and a self-resonant frequency of approximately 4.5 GHz are obtained, as shown by points 706 and 708, respectively. As described above, the simulation results for the IC including a monolithic inductor according to an embodiment of the invention is shown by curve 704 in FIG. 7. For purposes of the simulation, a cavity region was formed according to a masking pattern for defining 3 support members and a hub, similar to the configuration shown in FIG. 1 and FIG. 5A. Additionally, the cavity region was configured to extend through both the substrate and the dielectric layer thereon. In the simulation, the members each had a length of 271 μm and a 20 μm width. The hub diameter was 60 μm and the cavity diameter was 605 μm.

In the simulation, portions of the ground plane layer, the silicon substrate, and the silicon dioxide layer below the inductive element were removed according to the masking pattern for the cavity region. As shown in FIG. 7, curve 704 shows improvement over the inductor associated with curve 702. In particular, curve 704 shows that for the IC including a monolithic inductor formed in accordance with an embodiment of the invention, a Q factor of approximately 31 and a self-resonant frequency of approximately 7.1 GHz are obtained, as shown by points 710 and 712, respectively. This provides an improvement of approximately 10% in Q factor and 60% in self-resonant frequency with the addition of the cavity, as compared to the results shown in curve 702

Applicants present certain theoretical aspects above that are believed to be accurate that appear to explain observations made regarding embodiments of the invention based primarily on solid-state device theory. However, embodiments of the invention may be practiced without the theoretical aspects presented. Moreover, the theoretical aspects are presented with the understanding that Applicants do not seek to be bound by the theory presented.

While various embodiments of the invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. An integrated circuit (IC) device comprising:
   at least one base layer including a substrate and at least one ground plane layer;
   at least a first upper layer disposed on said base layer;
   at least a second upper layer disposed on said first upper layer, said substrate having at least one cavity region extending through at least said base layer, said first upper layer, and at least a portion of said second upper layer;
   wherein at least a portion of said second upper layer in said cavity region comprises at least one planar inductive element substantially parallel to a major surface of said base layer, said planar inductive element formed of at least one inductive trace and having a first contacting end and a second contacting end;
   at least one side wall partially enclosing said at least one cavity region, formed of portions of said base layer and said first upper layer defining said cavity, and extending transverse to said major surface of said base layer and a plane defined by said planar inductive element; and
   at least one support member which extends in a direction from said at least one sidewall to project at least partially into said cavity region in at least a first direction parallel to said major surface of said base layer, wherein said support member intersects said inductive trace at a plurality of distinct locations along a length of said at least one inductive trace intermediate of said first contacting end and said second contacting end.

2. The IC device of claim 1, further comprising at least a first electrically conductive trace electrically coupled to said first contacting end and at least a second electrically conductive trace electrically coupled said second contacting end, wherein said first conductive trace is formed in at least said first upper layer, and wherein said second conductive trace is formed in at least one of said first and said second upper layers.

3. The IC device of claim 1, wherein said support member extends across said cavity region between opposing surfaces of said at least one sidewall.

4. The IC device of claim 1, wherein said at least one support member comprises a plurality of support members, each extending from said at least one sidewall.

5. The IC device of claim 4, wherein at least a first and a second of said plurality of support members intersect in said cavity region.

6. The IC device of claim 1, wherein said planar inductive element comprises at least one of a spiral inductive component, a meandering inductive component, and a serpentine inductive component.

7. The IC device of claim 1, wherein a width of at least said portion of said support member intersecting said inductive trace is less than or equal to a width of said inductive trace.

8. The IC device of claim 1, wherein said integrated circuit (IC) device further comprises a third upper layer disposed on said second upper layer, said cavity region further extends through at least a portion of said third upper layer.

9. The IC device of claim 1, wherein said at least one support member is elongated and has a lengthwise dimension substantially coincident with the first direction.

10. An integrated circuit (IC) comprising:
at least one base layer including a substrate and at least one ground plane layer;
at least a first upper layer disposed on said base layer;
at least a second upper layer disposed on said first upper layer, said substrate having at least one cylindrical cavity region extending through at least said base layer, said first upper layer, and at least a portion of said second upper layer, wherein a central axis of said cylindrical cavity region is substantially perpendicular to a major surface said base layer,
wherein a portion of said second upper layer in said cavity region comprises at least one circular spiral planar inductive element substantially parallel to said major surface of said base layer, said planar inductive element formed of at least one inductive trace and having a first contacting end coupled to at least a first electrically conductive trace electrically coupled to said first contacting end and a second contacting end coupled to at least a second electrically conductive trace,
at least one side wall partially enclosing said at least one cavity region, formed of portions of said base layer and said first upper layer defining said cavity, and extending in a direction parallel to said central axis, and
a plurality of support members which extend radially from said central axis of said cylindrical cavity region toward said at least one sidewall, and wherein said support members intersect said inductive trace of said planar inductive element at a plurality of distinct locations along a length of said at least one inductive trace intermediate of said first contacting end and said second contacting end.

11. The IC of claim 10, wherein said inductive trace extends in a second direction parallel to said major surface of said base layer.

12. An integrated circuit (IC) device comprising:
at least one base layer including a substrate and at least one ground plane layer;
at least a first upper layer disposed on said base layer;
at least a second upper layer disposed on said first upper layer, said substrate having at least one cavity region extending through at least said base layer, said first upper layer, and at least a portion of said second upper layer;
wherein at least a portion of said second upper layer in said cavity region comprises at least one planar inductive element including at least one inductive trace which extends in at least two different directions to define an inductor plane which is substantially parallel to a major surface of said base layer, said planar inductive element having a first contacting end and a second contacting end;
at least one support member which extends in a direction aligned with said inductor plane, wherein said at least one support member intersects said at least one inductive trace at a plurality of distinct locations along a length of said at least one inductive trace intermediate of said first contacting end and said second contacting end.

\* \* \* \* \*